US008843801B2

(12) United States Patent
Ma et al.

(10) Patent No.: US 8,843,801 B2
(45) Date of Patent: Sep. 23, 2014

(54) WRITE CIRCUIT, READ CIRCUIT, MEMORY BUFFER AND MEMORY MODULE

(75) Inventors: Qingjiang Ma, Shanghai (CN); Haiyang Li, Shanghai (CN)

(73) Assignee: Montage Technology (Shanghai) Co., Ltd., Shanghai (CN)

( * ) Notice: Subject to any disclaimer, the term of this patent is extended or adjusted under 35 U.S.C. 154(b) by 93 days.

(21) Appl. No.: 13/579,201

(22) PCT Filed: Aug. 8, 2011

(86) PCT No.: PCT/CN2011/078097
§ 371 (c)(1),
(2), (4) Date: Aug. 15, 2012

(87) PCT Pub. No.: WO2013/007046
PCT Pub. Date: Jan. 17, 2013

(65) Prior Publication Data
US 2013/0046941 A1 Feb. 21, 2013

(30) Foreign Application Priority Data

Jul. 11, 2011 (CN) .......................... 2011 1 0193167

(51) Int. Cl.
*H03M 13/00* (2006.01)
*G11C 7/10* (2006.01)
*G06F 11/10* (2006.01)

(52) U.S. Cl.
CPC ............ *G11C 7/1006* (2013.01); *G11C 7/1084* (2013.01); *G11C 7/1096* (2013.01); *G06F 11/1004* (2013.01)
USPC ........... 714/758; 714/763; 714/762; 714/802; 711/155

(58) Field of Classification Search
CPC ........... H04Q 3/58; H04Q 1/26; H04Q 3/004; G06F 11/1004; G11C 7/1006; G11C 7/1084; G11C 7/1096; H03M 13/29; H03M 1/00; H03M 2201/14; H03M 2201/17; H03M 2201/3131; H03M 2201/52; H03M 2201/72; H04L 1/004
USPC .......... 714/758, 763, 762, 804; 711/E12.001, 711/155; 346/146.2
See application file for complete search history.

(56) References Cited

U.S. PATENT DOCUMENTS

2003/0221050 A1 11/2003 Eric Hong et al.
2011/0239080 A1* 9/2011 Sakaue et al. .................. 714/752
2012/0005396 A1 1/2012 Sargeant et al.

FOREIGN PATENT DOCUMENTS

CN 101231879 A 7/2008
CN 100481250 C 4/2009

OTHER PUBLICATIONS

International Search Report issued in International Patent Application No. PCT/CN2011/078097 dated Mar. 22, 2012.

*Primary Examiner* — Guy Lamarre
(74) *Attorney, Agent, or Firm* — Oliff PLC

(57) ABSTRACT

The present invention provides a write circuit, a read circuit, a memory buffer and a memory module. The write circuit includes: a data collecting unit, a first check unit, a data restoring unit, a first check data generating unit, a first adjusting unit and a write unit; the read circuit includes: a data read unit, a second check unit, an output data generating unit, a second check data generating unit, a second adjusting unit and an output unit; the memory buffer includes the write circuit and the read circuit; the memory module includes the memory buffer and multiple memory chips connected to the memory buffer.

15 Claims, 2 Drawing Sheets

WRITE CIRCUIT, READ CIRCUIT, MEMORY BUFFER AND MEMORY MODULE

BACKGROUND OF THE PRESENT INVENTION

1. Field of Invention

The present invention relates to a computer field, and specifically to a data write circuit, a read circuit, a memory buffer and a memory module.

2. Description of Related Arts

The DDR4 SDRAM is a next generation synchronous dynamic random access memory technology, and revolutionary changes occur in the DDR4 relative to the previous SDRAM technology. The new generation DDR4 SDRAM may use the through-silicon via (TSV) technology and the multilayer manufacturing technique, and may be of 4 stacks or 8 stacks, thereby greatly improving the capacity of a memory chip. The DDR4 may work in a frequency range from 1600 MHz to 3200 MHz, and may also be expanded to a frequency range from 2133 MHz to 4266 MHz, and the work voltage thereof is even reduced to a voltage range from 1.05V to 1.25V; and, in the DDR4, the number of banks is further increased, thereby improving a circuit of an input/output interface. Relative to the DDR3 SDRAM, the DDR4 has many advantages such as large memory capacity, high work frequency, low work voltage, and small power consumption.

The work frequency of a DDR4 memory chip is high, and the error rate of a data read/write operation is greatly increased, so how to read data out of or write data into a DDR4 X4 memory chip has become a problem to be solved by persons skilled in the art.

SUMMARY OF THE PRESENT INVENTION

An objective of the present invention lies in providing a write circuit for writing data into a memory chip.

Another objective of the present invention lies in providing a read circuit for reading data out of a memory chip.

Still another objective of the present invention lies in providing a memory buffer.

Yet another objective of the present invention lies in providing a memory module.

In order to achieve the foregoing objectives and other objectives, the write circuit for writing data into a memory chip provided in the present invention comprises:

a data collecting unit, disposed with a first data bus and a first data conversion control line, and used every time slot by the first data bus, the data bus having a data bus width a, for collecting a pieces of data and by the first data conversion control line for collecting first conversion control data corresponding to the a pieces of data, so as to collect a*b pieces of data to be checked and a pieces of check data in in total, b being a number of time slots, a*b being a numerical multiplication of the data bus width a and the number of time slots b;

a first check unit, connected to an output end of the data collecting unit, and used for checking whether a*b pieces of data to be checked and the b pieces of first conversion control data from the data collecting unit are incorrect according to the a pieces of check data from the data collecting unit, so as to output a first check result indicating whether data is correct;

a data restoring unit, connected to the output end of the data collecting unit, and used for, when the first conversion control data from the data collecting unit is a first value "0", negating a pieces of data to be checked corresponding to the conversion control data and then outputting the negated data; otherwise directly outputting the a pieces of data to be checked;

a first check data generating unit, connected to an output end of the data restoring unit, and used for separately generating a group of first check data according to $a_1$*b pieces of data and $a_2$*b pieces of data of a*b pieces of data from the data restoring unit respectively, in which, $a_1$*b+$a_2$*b is equal to a*b, $a_1$ being half of the data bus width a and $a_2$ being another half of the data bus width a, $a_1$*b being a numerical multiplication of $a_1$ and b and $a_2$*b being a numerical multiplication of $a_2$ and b;

a first adjusting unit, connected to an output end of the first check data generating unit and an output end of the first check unit, and used for, when the first check unit outputs the first check result indicating that data is incorrect, adjusting each group of first check data; otherwise, performing no adjustment; and a write unit, separately connected to an output end of the first adjusting unit and the output end of the data restoring unit, and used for outputting the $a_1$*b pieces of data from the data restoring unit and a group of first check data corresponding to the $a_1$*b pieces of data output by the first adjusting unit to a memory chip through a second data bus, and outputting the $a_2$*b pieces of data from the data restoring unit and a group of first check data corresponding to the $a_2$*b pieces of data output by the first adjusting unit to another memory chip through the second data bus.

The read circuit for reading data out of a memory chip provided in the present invention comprises:

a data read unit, disposed with a third data bus connected to two memory chips, and used, through the third data bus, by one memory chip for reading $a_1$*b pieces of data and corresponding first group 2*$a_1$ pieces of check data, and by the other memory chip for reading $a_2$*b pieces of data and corresponding second group 2*$a_2$ pieces of check data. The $a_1$ and $a_2$ is the third data bus width number of every memory chip, and the b is the number of sampled data time slot, and the check data time slot is 2;

a second check unit, connected to an output end of the data read unit, and used for checking whether the $a_1$*b pieces of data are incorrect according to the first group of check data, and checking whether the $a_2$*b pieces of data are incorrect according to the second group of check data, so as to output a second check result indicating whether the $a_1$*b+$a_2$*b pieces of data are incorrect, $a_1$*b+$a_2$*b being a sum of $a_1$*b and $a_2$*b;

an output data generating unit, connected to the output end of the data read unit, and used for determining second conversion control data corresponding to every a pieces of data of a*b pieces of data from the data read unit, and when the determined second conversion control data is a first value, negating a pieces of data corresponding to the second conversion control data and then outputting the negated data; otherwise directly outputting the a pieces of data, and outputting the second conversion control data corresponding to every a pieces of data, wherein, a*b=$a_1$*b+$a_2$*b, and a*b is a product of a number of a pieces data to be checked and b means output data time slot number, a second check data generating unit, connected to an output end of the output data generating unit, and used for generating second check data according to a*b pieces of data and b pieces of second conversion control data from the output data generating unit;

a second adjusting unit, connected to an output end of the second check data generating unit and an output end of the second check unit, and used for, when the second check unit outputs the second check result indicating that data is incorrect, adjusting the second check data and then outputting the adjusted second check data; otherwise directly outputting the second check data;

an output unit, separately connected to the output end of the output data generating unit and an output end of the second adjusting unit, used for, through a fourth data bus, outputting the a*b pieces of data from the output data generating unit and the second check data and a pieces of data 1 from the second adjusting unit, in which, whenever a pieces of data are output, and second conversion control data corresponding to the a pieces of data is output through a second data conversion control line.

The memory buffer provided in the present invention comprises: the foregoing write circuit, the foregoing read circuit and a control circuit, in which, the first data bus comprised by the write circuit is connected to the fourth data bus comprised by the read circuit, the second data bus comprised by the write circuit is connected to the third data bus comprised by the read circuit, the first data conversion control line comprised by the write circuit is connected to the second data conversion control line comprised by the read circuit, and the control circuit is disposed with a control signal bus, used for controlling a read/write operation of the write circuit and the read circuit according to a received control signal.

The memory module provided in the present invention comprises: the foregoing memory buffer and at least two memory chips, in which, the second data bus comprised by the memory buffer is connected to the at least two memory chips.

To sum up, the write circuit of the present invention can write the input data into two memory chips based on the conversion control data; the read circuit of the present invention can output the read data of a memory chip to a memory controller based on the conversion control data, thereby transmitting data with the memory controller in a low power consumption manner, and being further provided with the large capacity of the DDR4 X4 memory chip at the same time.

DETAILED DESCRIPTION OF THE PREFERRED EMBODIMENTS

Figure 1:
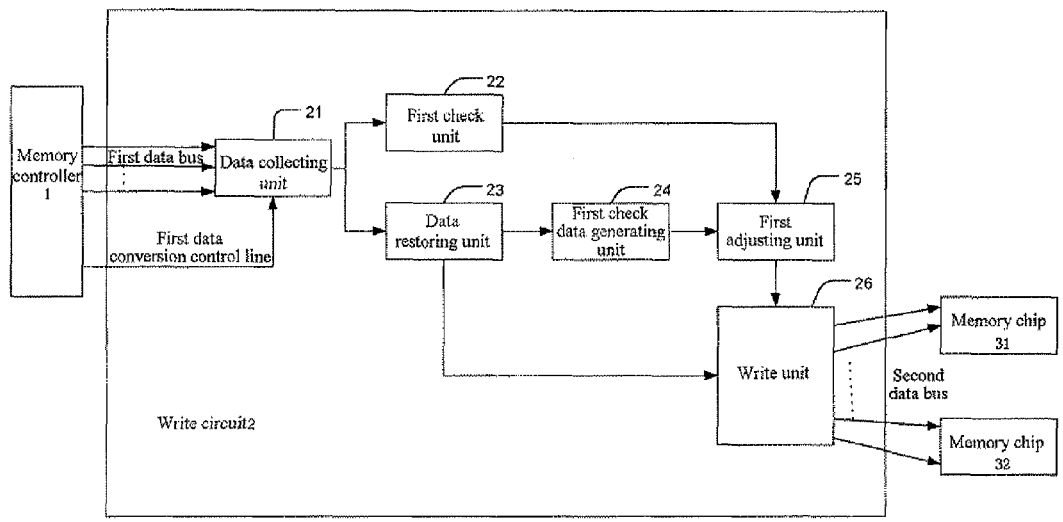
FIG. 1 is a schematic view of a write circuit for writing data into a memory chip consistent with the present invention.

FIG. 1 shows a schematic view of a write circuit 2 for writing data into a memory chip according to a preferable embodiment of the present invention. The write circuit 2 includes: a data collecting unit 21, a data restoring unit 23, a first check unit 22, a first check data generating unit 24, a first adjusting unit 25 and a write unit 26.

The data collecting unit 21 is disposed with a first data bus and a first data conversion control line, and used every time by the first data bus for collecting a pieces of data and by the first data conversion control line for collecting first conversion control data corresponding to the a pieces of data, so as to collect a number of "a*b" pieces of data to be checked and a number of "a" pieces of check data in total (i.e. the total number of the data to be checked is a*b, the total number of the check data is a).

For example, after the first data bus and the data conversion control line of the data collecting unit 21 are connected to a memory controller 1, the data collecting unit 21 collects a=8 pieces of data every time through DQ1[7:0] in the first data bus and outputs the collected data, and meanwhile further collects first conversion control data corresponding to the a=8 pieces of data through the data conversion control line DBI and outputs the collected data, through collection for multiple times in this way, for example, through collection for 9 times, the data collecting unit 21 outputs a*b=8*8 pieces of data to be checked, 8 pieces of check data and first conversion control data corresponding to every a'8 pieces of data in total.

Preferably, after the data collecting unit 21 collects the a*b pieces of data to be checked, data collected at the (b+1)th time is used as check data, in which, the first conversion control data corresponding to the number of a pieces of check data is a second value.

Preferably, the data collecting unit 21 may further include a first timing correcting circuit. The first timing correcting circuit is used for correcting the timing according to a write data collecting signal from the first data bus so as to correctly collect data from the first data bus and conversion control data from the first data conversion control line. For example, the first timing correcting circuit corrects the timing according to a write data collecting signal of DQS1 from the first data bus.

It should be noted that, persons skilled in the art should understand the circuit structure of the first timing correcting circuit according to the foregoing description, which is therefore not detailed again herein.

The first check unit 22 is connected to an output end of the data collecting unit 21, and used for checking whether a*b pieces of data to be checked and b pieces of first conversion control data from the data collecting unit 21 are incorrect according to the check data from the data collecting unit 21, so as to output a first check result indicating whether data is correct.

The circuit structure of the first check unit 22 is determined based on a coding manner adopted for data from the first data bus.

For example, if a CRC polynomial adopted for the a*b pieces of data to be checked from the first data bus is in a CRC coding manner of ATM-8 HEC, $X^8+X^2+X^1+1$, preferably, the first check unit 22 may include: a first generating circuit and a first comparing circuit.

The first generating circuit is connected to the output end of the data collecting unit 21, and used for generating first to-be-compared check data according to the a*b pieces of data to be checked from the data collecting unit 21 and the b pieces of first conversion control data from the data collecting unit 21.

Preferably, the first generating circuit may include a generating circuit for generating cyclic redundancy check data, for example, include a circuit formed of XOR gates.

For example, the a*b=8*8 pieces of data to be checked and the check data from the data collecting unit 21 are shown in Table 1, in which, the first column of data to the eighth column of data are respectively the data to be checked output by the data collecting unit 21 at the first time to the eighth time, and the ninth column of data CRC0 to CRC7 is the check data; the b+1=8+1=9 pieces of first conversion control data from the data collecting unit 21 are shown in Table 2. The ninth data of the first conversion control data is the first conversion control data corresponding to the check data:

TABLE 1

| D0  | D1  | D2  | D3  | D4  | D5  | D6  | D7  | CRC0 |
| D8  | D9  | D10 | D11 | D12 | D13 | D14 | D15 | CRC1 |
| D16 | D17 | D18 | D19 | D20 | D21 | D22 | D23 | CRC2 |
| D24 | D25 | D26 | D27 | D28 | D29 | D30 | D31 | CRC3 |
| D32 | D33 | D34 | D35 | D36 | D37 | D38 | D39 | CRC4 |

TABLE 1-continued

| D40 | D41 | D42 | D43 | D44 | D45 | D46 | D47 | CRC5 |
| D48 | D49 | D50 | D51 | D52 | D53 | D54 | D55 | CRC6 |
| D56 | D57 | D58 | D59 | D60 | D61 | D62 | D63 | CRC7 |

TABLE 2

| D64 | D65 | D66 | D67 | D68 | D69 | D70 | D71 | 1 |

The first generating circuit includes a group of first combination logic circuit, which generates first to-be-compared check data NewCRC[0], NewCRC[1], NewCRC[2], NewCRC[3], NewCRC[4], NewCRC[5], NewCRC[6], and NewCRC[7] according to the first to the eighth column of data D0 to D63 in Table 1 and the first conversion control data in Table 2, in which, a logic relational expression of the first combination logic circuit is shown in Expression 1.

Expression 1

$NewCRC[0] = [D69]\wedge[D68]\wedge[D67]\wedge[D66]\wedge[D64]\wedge[D63]\wedge[D60]\wedge$
$[D56]\wedge[D54]\wedge[D53]\wedge[D52]\wedge[D50]\wedge[D49]\wedge[D48]\wedge$
$[D45]\wedge[D43]\wedge[D40]\wedge[D39]\wedge[D35]\wedge[D34]\wedge[D31]\wedge$
$[D30]\wedge[D28]\wedge[D23]\wedge[D21]\wedge[D19]\wedge[D18]\wedge[D16]\wedge$
$[D14]\wedge[D12]\wedge[D8]\wedge[D7]\wedge[D6]\wedge[D0];$ $NewCRC[1] = [D70]\wedge[D66]\wedge[D65]\wedge[D63]\wedge[D61]\wedge[D60]\wedge[D57]\wedge$
$[D56]\wedge[D55]\wedge[D52]\wedge[D51]\wedge[D48]\wedge[D46]\wedge[D45]\wedge$
$[D44]\wedge[D43]\wedge[D41]\wedge[D39]\wedge[D36]\wedge[D34]\wedge[D32]\wedge$
$[D30]\wedge[D29]\wedge[D28]\wedge[D24]\wedge[D23]\wedge[D22]\wedge[D21]\wedge$
$[D20]\wedge[D18]\wedge[D17]\wedge[D16]\wedge[D15]\wedge[D14]\wedge[D13]\wedge$
$[D12]\wedge[D9]\wedge[D6]\wedge[D1]\wedge[D0];$ $NewCRC[2] = [D71]\wedge[D69]\wedge[D68]\wedge[D63]\wedge[D62]\wedge[D61]\wedge[D60]\wedge$
$[D58]\wedge[D57]\wedge[D54]\wedge[D50]\wedge[D48]\wedge[D47]\wedge[D46]\wedge$
$[D44]\wedge[D43]\wedge[D42]\wedge[D39]\wedge[D37]\wedge[D34]\wedge[D33]\wedge$
$[D29]\wedge[D28]\wedge[D25]\wedge[D24]\wedge[D22]\wedge[D17]\wedge[D15]\wedge$
$[D13]\wedge[D12]\wedge[D10]\wedge[D8]\wedge[D6]\wedge[D2]\wedge[D1]\wedge[D0];$ $NewCRC[3] = [D70]\wedge[D69]\wedge[D64]\wedge[D63]\wedge[D62]\wedge[D61]\wedge[D59]\wedge$
$[D58]\wedge[D55]\wedge[D51]\wedge[D49]\wedge[D48]\wedge[D47]\wedge[D45]\wedge$
$[D44]\wedge[D43]\wedge[D40]\wedge[D38]\wedge[D35]\wedge[D34]\wedge[D30]\wedge$
$[D29]\wedge[D26]\wedge[D25]\wedge[D23]\wedge[D18]\wedge[D16]\wedge[D16]\wedge$
$[D14]\wedge[D13]\wedge[D11]\wedge[D9]\wedge[D7]\wedge[D3]\wedge[D2]\wedge[D1];$ $NewCRC[4] = [D71]\wedge[D70]\wedge[D65]\wedge[D64]\wedge[D63]\wedge[D62]\wedge[D60]\wedge$
$[D59]\wedge[D56]\wedge[D52]\wedge[D50]\wedge[D49]\wedge[D48]\wedge[D46]\wedge$
$[D45]\wedge[D44]\wedge[D41]\wedge[D39]\wedge[D36]\wedge[D35]\wedge[D31]\wedge$
$[D30]\wedge[D27]\wedge[D26]\wedge[D24]\wedge[D19]\wedge[D17]\wedge[D15]\wedge$
$[D14]\wedge[D12]\wedge[D10]\wedge[D8]\wedge[D4]\wedge[D3]\wedge[D2];$ $NewCRC[5] = [D71]\wedge[D66]\wedge[D65]\wedge[D64]\wedge[D63]\wedge[D61]\wedge[D60]\wedge$
$[D57]\wedge[D53]\wedge[D51]\wedge[D50]\wedge[D49]\wedge[D47]\wedge[D46]\wedge$
$[D45]\wedge[D42]\wedge[D40]\wedge[D37]\wedge[D36]\wedge[D32]\wedge[D31]\wedge$
$[D28]\wedge[D27]\wedge[D25]\wedge[D20]\wedge[D18]\wedge[D16]\wedge[D15]\wedge$
$[D13]\wedge[D11]\wedge[D9]\wedge[D5]\wedge[D4]\wedge[D3];$ $NewCRC[6] = [D67]\wedge[D66]\wedge[D65]\wedge[D64]\wedge[D62]\wedge[D61]\wedge[D58]\wedge$
$[D54]\wedge[D52]\wedge[D51]\wedge[D50]\wedge[D48]\wedge[D47]\wedge[D46]\wedge$
$[D43]\wedge[D41]\wedge[D38]\wedge[D37]\wedge[D33]\wedge[D32]\wedge[D29]\wedge$
$[D28]\wedge[D26]\wedge[D21]\wedge[D19]\wedge[D17]\wedge[D16]\wedge[D14]\wedge$
$[D12]\wedge[D10]\wedge[D6]\wedge[D5]\wedge[D4];$ $NewCRC[7] = [D68]\wedge[D67]\wedge[D66]\wedge[D65]\wedge[D63]\wedge[D62]\wedge[D59]\wedge$
$[D55]\wedge[D53]\wedge[D52]\wedge[D51]\wedge[D49]\wedge[D48]\wedge[D47]\wedge$
$[D44]\wedge[D42]\wedge[D39]\wedge[D38]\wedge[D34]\wedge[D33]\wedge[D30]\wedge$
$[D30]\wedge[D29]\wedge[D27]\wedge[D22]\wedge[D20]\wedge[D18]\wedge[D17]\wedge$
$[D15]\wedge[D13]\wedge[D11]\wedge[D7]\wedge[D6]\wedge[D5].$ The first comparing circuit is connected to an output end of the first generating circuit and the output end of the data collecting unit 21, and used for comparing the first to-be-compared check data and the check data from the data collecting unit 21 to output the first check result indicating whether data is correct.

For example, the first comparing circuit compares the first to-be-compared check data NewCRC[0], NewCRC[1], NewCRC[2], NewCRC[3], NewCRC[4], NewCRC[5], NewCRC[6], and NewCRC[7] with the data output from the data collecting unit 21 at the ninth time, that is, the ninth column of data CRC0 to CRC7 in Table 1.

Preferably, the first comparing circuit includes eight 2-input XNOR gate circuits and one 8-input logic AND gate circuit, in which, a first 2-input XNOR gate circuit accesses the first to-be-compared check data NewCRC[0] and the check data CRC0, a second 2-input XNOR gate circuit accesses the first to-be-compared check data NewCRC[1] and the check data CRC1, a third 2-input XNOR gate circuit accesses the first to-be-compared check data NewCRC[2] and the check data CRC2, a fourth 2-input XNOR gate circuit accesses the first to-be-compared check data NewCRC[3] and the check data CRC3, a fifth 2-input XNOR gate circuit accesses the first to-be-compared check data NewCRC[4] and the check data CRC4, a sixth 2-input XNOR gate circuit accesses the first to-be-compared check data NewCRC[5] and the check data CRC5, a seventh 2-input XNOR gate circuit accesses the first to-be-compared check data NewCRC [6] and the check data CRC6, an eighth 2-input XNOR gate circuit accesses the first to-be-compared check data NewCRC [7] and the check data CRC7, and outputs of the eight XNOR gates are separately connected to an input end of the 8-input logic AND gate circuit, and therefore, when at least one of the first to-be-compared check data is different from the corresponding check data, the 8-input logic AND gate circuit outputs a first check result "0" indicating the output data is incorrect; otherwise, the 8-input XNOR gate circuit outputs a first check result "1" indicating the data is correct.

The data restoring unit 23 is connected to the output end of the data collecting unit 21, and used for, when the first conversion control data from the data collecting unit 21 is a first value, negating a pieces of data corresponding to the conversion control data and then outputting the negated data; otherwise directly outputting the a pieces of data.

For example, the first value is "0".

Preferably, the data restoring unit 23 may include second combination logic circuits whose number is a and whose logic relational expression is $\overline{A1}\cdot\overline{B1}+A1\cdot B1$, which, A1 in each of the second combination logic circuits is the first conversion control data from the data collecting unit 21, and B1 is one of the a pieces of data to be checked from the data collecting unit 21. For example, B1 of a first circuit of the second combination logic circuits is D0 of the a pieces of data to be checked D0, D1, D2, D3, D4, D5, D6, and D7 from the data collecting unit 21, B1 of a second circuit of the second combination logic circuits is D1 of the a pieces of data to be checked, B1 of a third circuit of the second combination logic circuits is D2 of the a pieces of data to be checked, B1 of a fourth circuit of the second combination logic circuits is D3 of the a pieces of data to be checked, B1 of a fifth circuit of the second combination logic circuits is D4 of the a pieces of data to be checked, B1 of a sixth circuit of the second combination logic circuits is D5 of the a pieces of data to be checked, B1 of a seventh circuit of the second combination logic circuits is D6 of the a pieces of data to be checked, and B1 of an eighth circuit of the second combination logic circuits is D7 of the a pieces of data to be checked. Thereby, when the accessed first conversion control data is the first value, that is, A1=0, the output of the 8 second combination logic circuits is $\overline{A1}\cdot\overline{B1}+A1\cdot B1=\overline{B1}$, that is, the 8 second combination logic circuits output negated data $\overline{D0}, \overline{D1}, \overline{D2}, \overline{D3}, \overline{D4}, \overline{D5}, \overline{D6},$ and $\overline{D7}$ of the a pieces of data to be checked D0, D1, D2, D3, D4, D5, D6, and D7; otherwise, when the accessed first conversion control data is the second value, that is, A1=1, the output of the 8 second combination logic circuits is $\overline{A1}\cdot\overline{B1}\cdot A1\cdot B1=B1$, that is, the 8 second combination logic circuits output the a pieces of data to be checked D0, D1, D2, D3, D4, D5, D6, and D7. Thereby, after the operation for b=8 times, the data restoring unit 23 may output a*b pieces of data.

The first check data generating unit 24 is connected to an output end of the data restoring unit 23, and used for separately generating a group of first check data according to $a_1$*b pieces of data and $a_2$*b pieces of data of a*b pieces of data from the data restoring unit 23 respectively, in which, $a_1$*b+$a_2$*b is equal to a*b.

The circuit structure of the first check data generating unit 24 is determined through the data check manner and the model of a memory chip for storing data. For example, if the memory chip for storing data is a DDR4 X4 memory chip, and the data check manner is the cyclic redundancy check (that is, CRC check), preferably, the first check data generating unit 24 may include two groups of generating circuits for generating cyclic redundancy check data.

For example, the a*b=8*8 pieces of data from the data restoring unit 23 are shown in Table 3, in which, the first column to the eighth column of data are respectively data output by the data restoring unit 23 at the first time to the eighth time.

TABLE 3

| d0  | d1  | d2  | d3  | d4  | d5  | d6  | d7  |
| d8  | d9  | d10 | d11 | d12 | d13 | d14 | d15 |
| d16 | d17 | d18 | d19 | d20 | d21 | d22 | d23 |
| d24 | d25 | d26 | d27 | d28 | d29 | d30 | d31 |
| d32 | d33 | d34 | d35 | d36 | d37 | d38 | d39 |
| d40 | d41 | d42 | d43 | d44 | d45 | d46 | d47 |
| d48 | d49 | d50 | d51 | d52 | d53 | d54 | d55 |
| d56 | d57 | d58 | d59 | d60 | d61 | d62 | d63 |

One group of generating circuit included by the first check data generating unit 24 generates the first group of first check data NewCRC[10], NewCRC[11], NewCRC[12], NewCRC[13], NewCRC[14], NewCRC[15], NewCRC[16], and NewCRC[17] according to $a_1$=4 pieces of a=8 pieces of data output by the data restoring unit 23 every time, for example, the first row to the fourth row of data shown in Table 3. The other group of generating circuit included by the first check data generating unit 24 generates the second group of first check data NewCRC[20], NewCRC[21], NewCRC[22], NewCRC[23], NewCRC[24], NewCRC[25], NewCRC[26], and NewCRC[27] according to the remaining $a_2$=a-$a_1$=8-4=4 pieces of data of the a=8 pieces of data output by the data restoring unit 23 every time, for example, the fifth row to the eighth row of data shown in Table 3.

Preferably, the generating circuit for generating the first group of first check data according to the data D0 to D31 includes a combination logic circuit whose logic relational expression is Expression 2, and the generating circuit for generating the second group of first check data according to the data D32 to D63 includes a combination logic circuit whose logic relational expression is Expression 3.

Expression 2

$NewCRC[10] = 1\wedge 1\wedge 1\wedge 1\wedge 1\wedge 1\wedge$
$1\wedge 1\wedge 1\wedge 1\wedge 1\wedge 1\wedge$
$1\wedge 1\wedge 1\wedge 1\wedge 1\wedge 1\wedge[d31]\wedge$
$[d30]\wedge[d28]\wedge[d23]\wedge[d21]\wedge[d19]\wedge[d18]\wedge[d16]\wedge$
$[d14]\wedge[d12]\wedge[d8]\wedge[d7]\wedge[d6]\wedge[d0];$ $NewCRC[11] = 1\wedge 1\wedge 1\wedge 1\wedge 1\wedge 1\wedge$
$1\wedge 1\wedge 1\wedge 1\wedge 1\wedge 1\wedge$
$1\wedge 1\wedge 1\wedge 1\wedge 1\wedge 1\wedge$
$[d30]\wedge[d29]\wedge[d28]\wedge[d24]\wedge[d23]\wedge[d22]\wedge[d21]\wedge$
$[d20]\wedge[d18]\wedge[d17]\wedge[d16]\wedge[d15]\wedge[d14]\wedge[d13]\wedge$
$[d12]\wedge[d9]\wedge[d6]\wedge[d1]\wedge[d0];$ $NewCRC[12] = 1\wedge 1\wedge 1\wedge 1\wedge 1\wedge 1\wedge$
$1\wedge 1\wedge 1\wedge 1\wedge 1\wedge 1\wedge$
$1\wedge 1\wedge 1\wedge 1\wedge 1\wedge 1\wedge$
$[d29]\wedge[d28]\wedge[d25]\wedge[d24]\wedge[d22]\wedge[d17]\wedge[d15]\wedge$
$[d13]\wedge[d12]\wedge[d10]\wedge[d8]\wedge[d6]\wedge[d2]\wedge[d1]\wedge[d0];$ $NewCRC[13] = 1\wedge 1\wedge 1\wedge 1\wedge 1\wedge 1\wedge$
$1\wedge 1\wedge 1\wedge 1\wedge 1\wedge 1\wedge$
$1\wedge 1\wedge 1\wedge 1\wedge 1\wedge 1\wedge[d30]\wedge$
$[d29]\wedge[d26]\wedge[d25]\wedge[d23]\wedge[d18]\wedge[d16]\wedge[d14]\wedge$
$[d13]\wedge[d11]\wedge[d9]\wedge[d7]\wedge[d3]\wedge[d2]\wedge[d1];$ $NewCRC[14] = 1\wedge 1\wedge 1\wedge 1\wedge 1\wedge 1\wedge$
$1\wedge 1\wedge 1\wedge 1\wedge 1\wedge 1\wedge$
$1\wedge 1\wedge 1\wedge 1\wedge 1\wedge 1\wedge[d31]\wedge$
$[d30]\wedge[d27]\wedge[d26]\wedge[d24]\wedge[d19]\wedge[d17]\wedge[d15]\wedge$
$[d14]\wedge[d12]\wedge[d10]\wedge[d8]\wedge[d4]\wedge[d3]\wedge[d2];$ $NewCRC[15] = 1\wedge 1\wedge 1\wedge 1\wedge 1\wedge 1\wedge$
$1\wedge 1\wedge 1\wedge 1\wedge 1\wedge 1\wedge$
$1\wedge 1\wedge 1\wedge 1\wedge 1\wedge 1\wedge[d31]\wedge$
$[d28]\wedge[d27]\wedge[d25]\wedge[d20]\wedge[d18]\wedge[d16]\wedge[d15]\wedge$
$[d13]\wedge[d11]\wedge[d9]\wedge[d5]\wedge[d4]\wedge[d3];$ $NewCRC[16] = 1\wedge 1\wedge 1\wedge 1\wedge 1\wedge 1\wedge$
$1\wedge 1\wedge 1\wedge 1\wedge 1\wedge 1\wedge$
$1\wedge 1\wedge 1\wedge 1\wedge 1\wedge 1\wedge[d29]\wedge$
$[d28]\wedge[d26]\wedge[d21]\wedge[d19]\wedge[d17]\wedge[d16]\wedge[d14]\wedge$
$[d12]\wedge[d10]\wedge[d6]\wedge[d5]\wedge[d4];$ $$NewCRC[17] = 1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge [d30]^\wedge$$
$$[d29]^\wedge[d27]^\wedge[d22]^\wedge[d20]^\wedge[d18]^\wedge[d17]^\wedge[d15]^\wedge$$
$$[d13]^\wedge[d11]^\wedge[d7]^\wedge[d6]^\wedge[d5];$$

Expression 3

$$NewCRC[20] = 1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge [d63]^\wedge$$
$$[d62]^\wedge[d60]^\wedge[d55]^\wedge[d53]^\wedge[d51]^\wedge[d50]^\wedge[d48]^\wedge$$
$$[d46]^\wedge[d44]^\wedge[d40]^\wedge[d39]^\wedge[d38]^\wedge[d32];$$

$$NewCRC[21] = 1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$[d62]^\wedge[d61]^\wedge[d60]^\wedge[d56]^\wedge[d55]^\wedge[d54]^\wedge[d53]^\wedge$$
$$[d52]^\wedge[d50]^\wedge[d49]^\wedge[d48]^\wedge[d47]^\wedge[d46]^\wedge[d45]^\wedge$$
$$[d44]^\wedge[d41]^\wedge[d38]^\wedge[d33]^\wedge[d32];$$

$$NewCRC[22] = 1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$[d61]^\wedge[d60]^\wedge[d57]^\wedge[d56]^\wedge[d54]^\wedge[d49]^\wedge[d47]^\wedge$$
$$[d45]^\wedge[d44]^\wedge[d42]^\wedge[d40]^\wedge[d38]^\wedge[d34]^\wedge[d33]^\wedge$$
$$[d32];$$

$$NewCRC[23] = 1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge [d62]^\wedge$$
$$[d61]^\wedge[d58]^\wedge[d57]^\wedge[d55]^\wedge[d50]^\wedge[d48]^\wedge[d46]^\wedge$$
$$[d45]^\wedge[d43]^\wedge[d41]^\wedge[d39]^\wedge[d35]^\wedge[d34]^\wedge[d33];$$

$$NewCRC[24] = 1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge [d63]^\wedge$$
$$[d62]^\wedge[d59]^\wedge[d58]^\wedge[d56]^\wedge[d51]^\wedge[d49]^\wedge[d47]^\wedge$$
$$[d46]^\wedge[d44]^\wedge[d42]^\wedge[d40]^\wedge[d36]^\wedge[d35]^\wedge[d34];$$

$$NewCRC[25] = 1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge [d63]^\wedge$$
$$[d60]^\wedge[d59]^\wedge[d57]^\wedge[d52]^\wedge[d50]^\wedge[d48]^\wedge[d47]^\wedge$$
$$[d45]^\wedge[d43]^\wedge[d41]^\wedge[d37]^\wedge[d36]^\wedge[d35];$$

$$NewCRC[26] = 1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge [d61]^\wedge$$
$$[d60]^\wedge[d58]^\wedge[d53]^\wedge[d51]^\wedge[d49]^\wedge[d48]^\wedge[d46]^\wedge$$
$$[d44]^\wedge[d42]^\wedge[d38]^\wedge[d37]^\wedge[d36];$$

$$NewCRC[27] = 1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge 1^\wedge$$
$$1^\wedge 1^\wedge 1^\wedge 1^\wedge 1^\wedge 1^\wedge [d62]^\wedge$$
$$[d61]^\wedge[d59]^\wedge[d54]^\wedge[d52]^\wedge[d50]^\wedge[d49]^\wedge[d47]^\wedge$$
$$[d45]^\wedge[d43]^\wedge[d39]^\wedge[d38]^\wedge[d37].$$

It should be noted that, persons skilled in the art should understand that, the structure of the two groups of generating circuits is merely exemplified, and not intended to limit the present invention.

The first adjusting unit 25 is connected to an output end of the first check data generating unit 24 and an output end of the first check unit 22, and used for, when the first check unit 22 outputs the first check result indicating that data is incorrect, adjusting each group of first check data; otherwise, performing no adjustment.

Preferably, the first adjusting unit 25 includes two third combination logic circuits whose logic relational expressions are both $\overline{A2\cdot B2} \div A2 \cdot B2$, in which, in one of the third combination logic circuits, A2 is a first check result output by the first check unit 22, and B2 is one of the first group of first check data NewCRC[10], NewCRC[11], NewCRC[12], NewCRC[13], NewCRC[14], NewCRC[15], NewCRC[16], and NewCRC[17], for example, NewCRC[14]; in the other of the third combination logic circuits, A2 is a first check result output by the first check unit 22, and B2 is one of the second group of first check data NewCRC[20], NewCRC[21], NewCRC[22], NewCRC[23], NewCRC[24], NewCRC[25], NewCRC[26], and NewCRC[27], for example, NewCRC[25]. Thereby, when the first check unit 22 outputs a first check result indicating data is incorrect, that is, A2="0", one of the third combination logic circuits outputs $\overline{B} = \overline{NewCRC[14]}$, and the other of the third combination logic circuits outputs $\overline{B} = \overline{NewCRC[25]}$, that is, the first adjusting unit 25 directly outputs the first group of first check data NewCRC[10], NewCRC[11], NewCRC[12], NewCRC[13], NewCRC[15], NewCRC[16], and NewCRC[17] without performing any processing, and only negates NewCRC[14] and then outputs the negated NewCRC[14]; and meanwhile, directly outputs the second group of first check data NewCRC[20], NewCRC[21], NewCRC[22], NewCRC[23], NewCRC[24], NewCRC[26], and NewCRC[27] without performing any processing, and only negates NewCRC[25] and then outputs the negated NewCRC[25]. While, when the first check unit 22 outputs a first check result indicating data is correct, that is, A2="1", one of the third combination logic circuits outputs B2=NewCRC[14], and the other of the third combination logic circuits outputs B2=NewCRC[25], that is, the first adjusting unit 25 outputs the first group of first check data and the second group of first check data.

It should be noted that, the first check unit 22 may also include more than two to eight combination logic circuits whose logic relational expressions are all $\overline{A2\cdot B2} \div A2 \cdot B2$, which are used for, when the first check unit 22 outputs a first check result indicating data is incorrect, negating two or more than two of the first group of first check data and then outputting the negated data, and negating one or more of the second group of first check data and then outputting the negated data respectively; or which are used for, when the first check unit 22 outputs a first check result indicating data is incorrect, negating one or more of the first group of first check data and then outputting the negated data, and negating two or more than two of the second group of first check data and then outputting the negated data respectively.

The write unit 26 is separately connected to an output end of the first adjusting unit 25 and the output end of the data restoring unit 23, and used for outputting the a1*b pieces of data of the a*b pieces of data from the data restoring unit 23 and a group of first check data corresponding to the $a_1$*b pieces of data output by the first adjusting unit 25 to a memory chip through a second data bus, and outputting the $a_2$*b pieces of data the a*b pieces of data from the data restoring unit 23 and a group of first check data corresponding to the $a_2$*b pieces of data output by the first adjusting unit 25 to another memory chip through the second data bus.

For example, the write unit 26 writes the $a_1$*b=4*8 pieces of data from the data restoring unit 23, for example, the first to the fourth row of the first to the eighth column of data in Table 3 and the first group of first check data output by the first adjusting unit 25 into the DDR4 X4 memory chip 31 through in DQ2[3:0] in the second data bus at the ascending edge or descending edge of a generated write data collecting signal output by DQS21 in the second data bus; and writes the $a_2$*b=4*8 pieces of data from the data restoring unit 23, for example, the fifth to the eighth row of the first to the eighth column of data in Table 3 and the second group of first check data output by the first adjusting unit 25 into the DDR4 X4 memory chip 32 through in DQ2[7:4] in the second data bus at the ascending edge or descending edge of a generated write data collecting signal output by DQS22 in the second data bus.

Persons skilled in the art should understand that, the write unit 26 may generate the write data collecting signals output by DQS21 and DQS22 in the second data bus by delaying the write data collecting signal from DQS1 in the first data bus, which is therefore not detailed again herein.

It should be noted that, persons skilled in the art should understand that, whenever accessing a=8 pieces of data output from the data restoring unit 23, the write unit 26 may write $a_1$=4 pieces thereof into the memory chip 31 through DQ2[3:0] in the second data bus, write the remaining $a_2$=4 pieces thereof into the memory chip 32 through DQ2[7:4] in the second data bus, and after writing $a_1$=4 pieces of the a=8 pieces of data output from the data restoring unit 23 into the memory chip 31 through DQ2[3:0] in the second data bus, and writing the remaining $a_2$=4 pieces thereof into the memory chip 32 through DQ2[7:4] in the second data bus at the eighth time, then write 4 pieces of the first group of first check data output by the first adjusting unit 25 into the memory chip 31 through DQ2[3:0] in the second data bus, write 4 pieces of the second group of first check data into the memory chip 32 through DQ2[7:4] in the second data bus, then write the remaining 4 pieces of the first group of first check data output by the first adjusting unit 25 into the memory chip 31 through DQ2[3:0] in the second data bus, and write the remaining 4 pieces of data in the second group of first check data into the memory chip 32 through DQ2[7:4] in the second data bus.

To sum up, the write circuit consistent with the present invention can write a group of data provided by a memory controller, for example, 64 pieces of data and check data, into different memory chips respectively, especially may transmit data with the memory controller based on conversion control data, and write the data and check data into two DDR4 X4 memory chips respectively, which not only may achieve low power consumption of transmitting data with the memory controller, but also can take full advantage of the large capacity of the DDR4 X4 memory chip.

Figure 2:
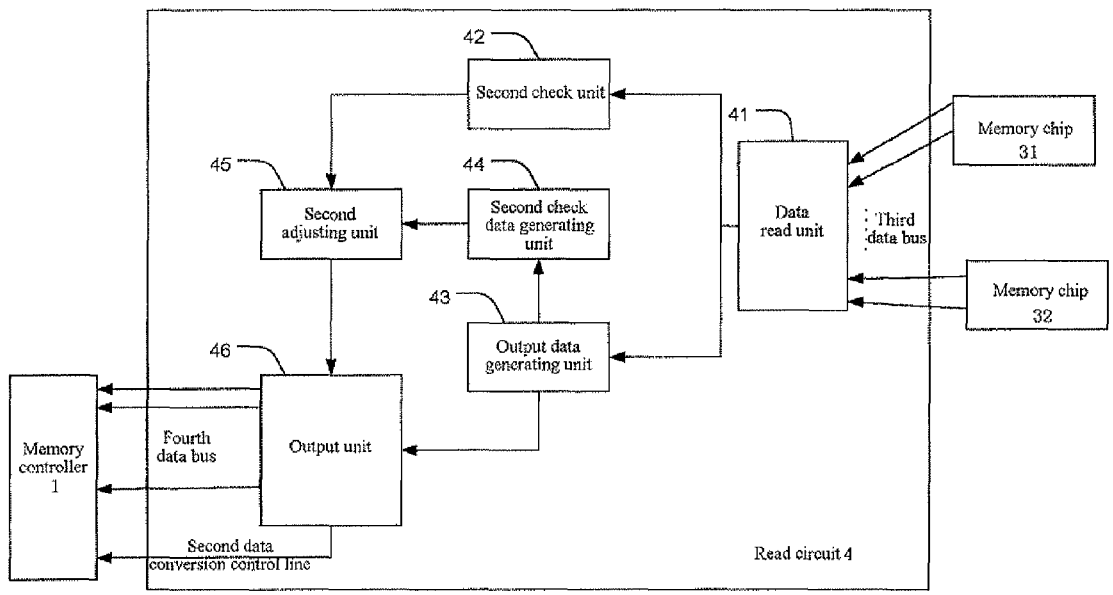
FIG. 2 is a schematic view of a read circuit for reading data out of a memory chip consistent with the present invention.

FIG. 2 shows a schematic view of a read circuit for reading data out of a memory chip according to a preferable embodiment of the present invention. The read circuit 4 includes: a data read unit 41, a second check unit 42, an output data generating unit 43, a second check data generating unit 44, a second adjusting unit 45 and an output unit 46.

The data read unit 41 is disposed with a third data bus connected to two memory chips, and used, through the third data bus, by one memory chip for reading $a_1$*b pieces of data and corresponding first group of check data, and by the other memory chip for reading $a_2$*b pieces of data and corresponding second group of check data.

For example, the data read unit 41 reads data of a memory chip through a third data bus at a clock edge.

Preferably, the data read unit 41 includes a read sub-unit, used every time by one memory chip for reading $a_1$ pieces of second data, and by the other memory chip for reading $a_2$ pieces of second data, and then outputting the $a_1+a_2$ pieces of data.

For example, the read sub-unit, according to a read data collecting signal from DQS3 in the third data bus, reads $a_1$=4 pieces of data via the memory chip 31 through DQ3[3:0] in the third data bus, and reads $a_2$=4 pieces of data via the memory chip 32 through DQ3[7:4] in the third data bus every time, and outputs the $a_1+a_2$=4+4=8 pieces of data. Thereby, the read sub-unit reads data for 10 times and outputs the data, and in total outputs $a_1$*b=4*8 pieces of data and $a_1$*2=4*2 pieces of the first group of check data from the memory chip 31, and $a_2$*b=4*8 pieces of data and $a_2$*2=4*2 pieces of the second group of check data from the memory chip 32. Preferably, the read sub-unit uses the data read through DQ3[3:0] in the third data bus at the (b+1)th time and at the (b+2)th time as the first group of check data, and uses the data read through DQ3[7:4] in the third data bus at the (b+1)th time and at the (b+2)th time as the second group of check data. For example, as shown in Table 4, the first to the eighth column of data are respectively $a_1$*b=4*8 pieces of data of the memory chip 31 read by the read sub-unit through DQ3[3:0] in the third data bus at the first to the eighth time, and the ninth to the tenth column of data are the first group of check data of the memory chip 31 read by the read sub-unit through DQ3[3:0] in the third data bus at the ninth to the tenth time. In data shown in Table 5, the first to the eighth column of data are respectively $a_2$*b=4*8 pieces of data of the memory chip 32 read by the read sub-unit through DQ3[7:4] in the third data bus at the first to the eighth time, and the ninth to the tenth column of data are the second group of check data of the memory chip 32 read by the read sub-unit through DQ3[7:4] in the third data bus at the ninth to the tenth time.

TABLE 4

| D0' | D1' | D2' | D3' | D4' | D5' | D6' | D7' | NewCRC[10]'' | NewCRC[14]'' |
|---|---|---|---|---|---|---|---|---|---|
| D8' | D9' | D10' | D11' | D12' | D13' | D14' | D15' | NewCRC[11]'' | NewCRC[15]'' |
| D16' | D17' | D18' | D19' | D20' | D21' | D22' | D23' | NewCRC[12]'' | NewCRC[16]'' |
| D24' | D25' | D26' | D27' | D28' | D29' | D30' | D31' | NewCRC[13]'' | NewCRC[17]'' |

TABLE 5

| D32' | D33' | D34' | D35' | D36' | D37' | D38' | D39' | NewCRC[20]" | NewCRC[24]" |
| D40' | D41' | D42' | D43' | D44' | D45' | D46' | D47' | NewCRC[21]" | NewCRC[25]" |
| D48' | D49' | D50' | D51' | D52' | D53' | D54' | D55' | NewCRC[22]" | NewCRC[26]" |
| D56' | D57' | D58' | D59' | D60' | D61' | D62' | D63' | NewCRC[23]" | NewCRC[27]" |

Moreover, it should be noted that, the manner in which the data read unit 41 reads data is not limited to the shown manner.

More preferably, the data read unit 41 may include a second timing correcting circuit, used for correcting the timing according to a read data collecting signal from the third data bus so as to accurately read data through the third data bus. For example, the second timing correcting circuit corrects the timing according to a read data collecting signal from DQS3 in the third data bus.

It should be noted that, persons skilled in the art should understand the circuit structure of the second timing correcting circuit according to the foregoing description, which is therefore not detailed again herein.

The second check unit 42 is connected to an output end of the data read unit 41, and used for checking whether the $a_1*b$ pieces of data from the data read unit 41 are incorrect according to the first group of check data, and checking whether the $a_2*b$ pieces of data from the data read unit 41 are incorrect according to the second group of check data, so as to output a second check result indicating whether the $a_1*b+a_2*b$ pieces of data are incorrect.

The circuit structure of the second check unit 42 is determined based on the first check data generating circuit included by the write circuit 2 shown in FIG. 1. For example, the first check data generating unit 24 of the write circuit 2 generates the first group of first check data and the second group of first check data by use of the cyclic redundancy check (CRC) method, and the second check unit 42 also performs check by use of the CRC check method. Preferably, the second check unit 42 may include: a second generating circuit and a second comparing circuit.

The second generating circuit is used for generating a first group of second to-be-compared check data and a second group of second to-be-compared check data separately according to the $a_1*b$ pieces of data and the $a_2*b$ pieces of data from the data read unit 41 respectively.

For example, $a_1*b=4*8$ pieces of data and $a_2*b=4*8$ pieces of data from the data read unit 41 are respectively shown in Table 4 and Table 5, and the second generating circuit generates a first group of second to-be-compared check data NewCRC[10]', NewCRC[11]', NewCRC[12]', NewCRC[13]', NewCRC[14]', NewCRC[15]', NewCRC[16]', and NewCRC[17]'according to the a1*b=4*8 pieces of data shown in Table 4 from the data read unit 41, and generates a second group of second to-be-compared check data NewCRC[20]', NewCRC[21]', NewCRC[22]', NewCRC[23]', NewCRC[24]', NewCRC[25]', NewCRC[26]', and NewCRC[27]'according to the $a_2*b=4*8$ pieces of data shown in Table 5 from the data read unit 41.

Preferably, the second generating circuit may include two generating circuits for generating cyclic redundancy check data, in which one generating circuit includes a combination logic circuit whose logic relational expression is Expression 4, and the other generating circuit includes a combination logic circuit whose logic relational expression is Expression 5.

Expression 4

$$NewCRC[10]' = 1\wedge 1\wedge 1\wedge 1\wedge 1\wedge 1\wedge 1\wedge$$
$$1\wedge 1\wedge 1\wedge 1\wedge 1\wedge 1\wedge 1\wedge$$
$$1\wedge 1\wedge 1\wedge 1\wedge 1\wedge 1\wedge [D31']\wedge$$
$$[D30']\wedge [D28']\wedge [D23']\wedge [D21']\wedge [D19']\wedge [D18']\wedge$$
$$[D16']\wedge [D14']\wedge [D12']\wedge [D8']\wedge [D7']\wedge [D6']\wedge [D0'];$$

$$NewCRC[11]' = 1\wedge 1\wedge 1\wedge 1\wedge 1\wedge 1\wedge 1\wedge$$
$$1\wedge 1\wedge 1\wedge 1\wedge 1\wedge 1\wedge 1\wedge$$
$$1\wedge 1\wedge 1\wedge 1\wedge 1\wedge 1\wedge 1\wedge$$
$$[D30']\wedge [D29']\wedge [D28']\wedge [D24']\wedge [D23']\wedge [D22']\wedge$$
$$[D21']\wedge [D20']\wedge [D18']\wedge [D17']\wedge [D16']\wedge [D15']\wedge$$
$$[D14']\wedge [D13']\wedge [D12']\wedge [D9']\wedge [D6']\wedge [D1']\wedge$$
$$[D0'];$$

$$NewCRC[12]' = 1\wedge 1\wedge 1\wedge 1\wedge 1\wedge 1\wedge 1\wedge$$
$$1\wedge 1\wedge 1\wedge 1\wedge 1\wedge 1\wedge 1\wedge$$
$$1\wedge 1\wedge 1\wedge 1\wedge 1\wedge 1\wedge 1\wedge$$
$$[D29']\wedge [D28']\wedge [D25']\wedge [D24']\wedge [D22']\wedge [D17']\wedge$$
$$[D15']\wedge [D13']\wedge [D12']\wedge [D10']\wedge [D8']\wedge [D6']\wedge$$
$$[D2']\wedge [D1']\wedge [D0'];$$

$$NewCRC[13]' = 1\wedge 1\wedge 1\wedge 1\wedge 1\wedge 1\wedge 1\wedge$$
$$1\wedge 1\wedge 1\wedge 1\wedge 1\wedge 1\wedge 1\wedge$$
$$1\wedge 1\wedge 1\wedge 1\wedge 1\wedge 1\wedge [D30']\wedge$$
$$[D29']\wedge [D26']\wedge [D25']\wedge [D23]\wedge [D18']\wedge [D16']\wedge$$
$$[D14']\wedge [D13']\wedge [D11']\wedge [D9']\wedge [D7']\wedge [D3']\wedge$$
$$[D2']\wedge [D1'];$$

$$NewCRC[14]' = 1\wedge 1\wedge 1\wedge 1\wedge 1\wedge 1\wedge 1\wedge$$
$$1\wedge 1\wedge 1\wedge 1\wedge 1\wedge 1\wedge 1\wedge$$
$$1\wedge 1\wedge 1\wedge 1\wedge 1\wedge 1\wedge [D31']\wedge$$
$$[D30']\wedge [D27']\wedge [D26']\wedge [D24']\wedge [D19']\wedge [D17']\wedge$$
$$[D15']\wedge [D14']\wedge [D12']\wedge [D10']\wedge [D8']\wedge [D4']\wedge$$
$$[D3']\wedge [D2'];$$

$$NewCRC[15]' = 1\wedge 1\wedge 1\wedge 1\wedge 1\wedge 1\wedge 1\wedge$$
$$1\wedge 1\wedge 1\wedge 1\wedge 1\wedge 1\wedge 1\wedge$$
$$1\wedge 1\wedge 1\wedge 1\wedge 1\wedge 1\wedge [D31']\wedge$$
$$[D28']\wedge [D27']\wedge [D25']\wedge [D20']\wedge [D18']\wedge [D16']\wedge$$
$$[D15']\wedge [D13']\wedge [D11']\wedge [D9']\wedge [D5']\wedge [D4']\wedge$$
$$[D3'];$$

$NewCRC[16]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge[D29']\wedge$
$[D28']\wedge[D26']\wedge[D21']\wedge[D19']\wedge[D17']\wedge[D16']\wedge$
$[D14']\wedge[D12']\wedge[D10']\wedge[D6']\wedge[D5']\wedge[D4'];$ $NewCRC[17]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge[D30']\wedge$
$[D29']\wedge[D27']\wedge[D22']\wedge[D20']\wedge[D18']\wedge[D17']\wedge$
$[D15']\wedge[D13']\wedge[D11']\wedge[D7']\wedge[D6']\wedge[D5'];$ Expression 5

$NewCRC[20]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge[D63']\wedge$
$[D62']\wedge[D60']\wedge[D55']\wedge[D53']\wedge[D51']\wedge[D50']\wedge$
$[D48']\wedge[D46']\wedge[D44']\wedge[D40']\wedge[D39']\wedge[D38']\wedge$
$[D32'];$ $NewCRC[21]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge1\wedge$
$[D62']\wedge[D61']\wedge[D60']\wedge[D56']\wedge[D55']\wedge[D54']\wedge$
$[D53']\wedge[D52']\wedge[D50']\wedge[D49']\wedge[D48']\wedge[D47']\wedge$
$[D46']\wedge[D45']\wedge[D44']\wedge[D41']\wedge[D38']\wedge[D33']\wedge$
$[D32'];$ $NewCRC[22]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge1\wedge$
$[D61']\wedge[D60']\wedge[D57']\wedge[D56']\wedge[D54']\wedge[D49']\wedge$
$[D47']\wedge[D45']\wedge[D44']\wedge[D42']\wedge[D40']\wedge[D38']\wedge$
$[D34']\wedge[D33']\wedge[D32'];$ $NewCRC[23]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge[D62']\wedge$
$[D61']\wedge[D58']\wedge[D57']\wedge[D55']\wedge[D50']\wedge[D48']\wedge$
$[D46']\wedge[D45']\wedge[D43']\wedge[D41']\wedge[D39']\wedge[D35']\wedge$
$[D34']\wedge[D33'];$ $NewCRC[24]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge[D63']\wedge$
$[D62']\wedge[D59']\wedge[D58']\wedge[D56']\wedge[D51']\wedge[D49']\wedge$
$[D47']\wedge[D46']\wedge[D44']\wedge[D42']\wedge[D40']\wedge[D36']\wedge$
$[D35']\wedge[D34'];$ $NewCRC[25]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge[D63']\wedge$
$[D60']\wedge[D59']\wedge[D57']\wedge[D52']\wedge[D50']\wedge[D48']\wedge$
$[D47']\wedge[D45']\wedge[D43']\wedge[D41']\wedge[D37']\wedge[D36']\wedge$
$[D35'];$ $NewCRC[26]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge[D61']\wedge$
$[D60']\wedge[D58']\wedge[D53']\wedge[D51']\wedge[D49']\wedge[D48']\wedge$
$[D46']\wedge[D44']\wedge[D42']\wedge[D38']\wedge[D37']\wedge[D36'];$ $NewCRC[27]' = 1\wedge1\wedge1\wedge1\wedge1\wedge1\wedge1\wedge$
$1\wedge1\wedge1\wedge1\wedge1\wedge1\wedge1\wedge$
$1\wedge1\wedge1\wedge1\wedge1\wedge1\wedge[D62']\wedge$
$[D61']\wedge[D59']\wedge[D54']\wedge[D52']\wedge[D50']\wedge[D49']\wedge$
$[D47']\wedge[D45']\wedge[D43']\wedge[D39']\wedge[D38']\wedge[D37'];$ The second comparing circuit is connected to an output end of the second generating circuit, and used for comparing the first group of second to-be-compared check data and the first group of check data output by the data read unit 41, and comparing the second group of second to-be-compared check data and the second group of check data output by the data read unit so as to output the second check result indicating whether the $a_1*b+a_2*b$ pieces of data are incorrect.

For example, the second comparing circuit is used for comparing the first group of second to-be-compared check data NewCRC[10]', NewCRC[11]', NewCRC[12]', NewCRC[13]', NewCRC[14]', NewCRC[15]', NewCRC[16]', and NewCRC[17]' with the first group of check data NewCRC[10]', NewCRC[11]', NewCRC[12]', NewCRC[13]' output by the data read unit 41 at the ninth time, as well as the first group of check data NewCRC[14]', NewCRC[15]', NewCRC[16]', NewCRC[17]' output by the data read unit 41 at the tenth time, and comparing the second group of second to-be-compared check data NewCRC[20]', NewCRC[21]', NewCRC[22]', NewCRC[23]', NewCRC[24]', NewCRC[25]', NewCRC[26]', and NewCRC[27]' with the second group of check data NewCRC[20]', NewCRC[21]', NewCRC[22]', NewCRC[23]' output by the data read unit 41 at the ninth time, as well as the second group of check data NewCRC[24]', NewCRC[25]', NewCRC[26]', NewCRC[27]' output by the data read unit 41 at the tenth time, so as to obtain the second group of comparing result.

Preferably, the second comparing circuit includes sixteen 2-input XNOR gate circuits and one 16-input logic AND gate circuit. The first 2-input XNOR gate circuit accesses the first group of second to-be-compared check data NewCRC[10]' and the first group of check data NewCRC[10]' output by the data read unit 41, the second 2-input XNOR gate circuit accesses the second to-be-compared check data NewCRC[11]' and the first group of check data NewCRC[11]' output by the data read unit 41, the third 2-input XNOR gate circuit accesses the second to-be-compared check data NewCRC[12]' and the first group of check data NewCRC[12]' output by the data read unit 41, the fourth 2-input XNOR gate circuit accesses the second to-be-compared check data NewCRC[13]' and the first group of check data NewCRC[13]' output by the data read unit 41, the fifth 2-input XNOR gate circuit accesses the second to-be-compared check data NewCRC[14]' and the first group of check data NewCRC[14]' output by the data read unit 41, the sixth 2-input XNOR gate circuit accesses the second to-be-compared check data NewCRC[15]' and the first group of check data NewCRC[15]' output by the data read unit 41, the seventh 2-input XNOR gate circuit accesses the second to-be-compared check data NewCRC[16]' and the first group of check data NewCRC[16]' output by the data read unit 41, the eighth 2-input XNOR gate circuit accesses the second to-be-compared check data NewCRC[17]' and the first group of check data NewCRC[17]' output by the data read unit 41, the ninth 2-input XNOR gate circuit accesses the second group of second to-be-compared check data NewCRC[20]' and the second group of check data NewCRC[20]' output by the data read unit 41, the tenth 2-input XNOR gate circuit accesses the second to-be-compared check data NewCRC[21]' and the second group of check data NewCRC[21]' output by the data read unit 41, the eleventh 2-input XNOR gate circuit accesses the second to-be-compared check data NewCRC[22]' and the second group of check data NewCRC[22]' output by the data read unit 41, the twelfth 2-input XNOR gate circuit accesses the second to-be-compared check data NewCRC[23]' and the second group of check data NewCRC[23]' output by the data read unit 41, the thirteenth 2-input XNOR gate circuit accesses the second to-be-compared check data NewCRC[24]' and the second group of check data NewCRC[24]' output by the data read unit 41, the fourteenth 2-input XNOR gate circuit accesses the second to-be-compared check data NewCRC[25]' and the second group of check data NewCRC[25]' output by the data read unit 41, the fifteenth 2-input XNOR gate circuit accesses the second to-be-compared check data NewCRC[26]' and the second group of check data NewCRC[26]' output by the data read unit 41, the sixteenth 2-input XNOR gate circuit accesses the second to-be-compared check data NewCRC[27]' and the second group of check data NewCRC[27]' output by the data read unit 41, and output ends of the sixteen 2-input XNOR gate circuits are separately connected to one input end of the 16-input logic AND gate circuit. Thereby, when at least one of the first group of second to-be-compared check data is different from the corresponding check data in the first group of check data output by the data read unit 41, the corresponding XNOR gate circuit outputs a comparing result "0" indicating the first group of data is incorrect; otherwise, the 8 XNOR gates all output a comparing result "1" indicating the first group of data is correct. However, when at least one of the second group of second to-be-compared check data is different from the corresponding check data in the second group of check data output by the data read unit 41, the corresponding XNOR gate circuit outputs a comparing result "0" indicating the second group of data is incorrect; otherwise, the 8 XNOR gates all output a comparing result "1" indicating the second group of data is correct. When the sixteen 2-input XNOR gate circuits all output the data "1", the 16-input logic AND gate circuit outputs a second check result "1" indicating data is correct, or otherwise, outputs a second check result "0" indicating data is incorrect.

It should be noted that, persons skilled in the art should understand that, the shown second comparing circuit is merely exemplified, and not intended to limit the present invention. For example, the second comparing circuit may also include eight 2-input XNOR gate circuits, and eight fourth combination logic circuits whose logic relational expressions are $A3 \cdot B3 \cdot C3 + \overline{A3} \cdot \overline{B3} \cdot \overline{C3}$, in which, the eight 2-input XNOR gates are used for comparing the first data to be checked and the first group of check data output from the data read unit 41, and in each of the fourth combination logic circuits, C3 is data output from one of the eight 2-input XNOR gates, A3 is one of the second group of data to be checked, and B3 is one, corresponding to A3, of the second group of check data output from the data read unit 41.

The output data generating unit 43 is connected to the output end of the data read unit 41, and used for determining second conversion control data corresponding to every a pieces of data of a*b pieces of data from the data read unit 41, and when the determined second conversion control data is a first value, negating a pieces of data corresponding to the second conversion control data and then outputting the negated data; otherwise directly outputting the a pieces of data, and outputting the second conversion control data corresponding to every a pieces of data, in which, $a*b=a_1*b+a_2*b$.

The manner for determining the second conversion control data corresponding to every a pieces of data is as follows: when the quantity of the data being "1" of the a pieces of data is greater than or equal to one half of the a, it is determined that the second conversion control data corresponding to the a pieces of data is the second value, for example, "1"; otherwise, the second conversion control data corresponding to the a pieces of data is the first value, for example, "0".

Preferably, the output data generating unit 43 includes an accumulator, a comparing circuit and fifth combination logic circuits whose number is a and whose logic relationships are $\overline{A3} \cdot \overline{B3} + A3 \cdot B3$. The accumulator is used for adding $a_1$ (for example $a_1=4$) pieces of data from the memory chip 31 and $a_2$ (for example $a_2=4$) pieces of data from the memory chip 32 which are output by the data read unit 41 every time, an output end of the accumulator is connected to the comparing circuit, and the comparing circuit is used for comparing the data output by the accumulator and a binary number 100 (that is, $(a_1+a_2)/2=(4+4)/2=4$). When the data output by the accumulator is greater than or equal to the binary 100, the comparing circuit outputs the second conversion control data (equal to the second value "1") corresponding to the $a_1+a_2=4+4=8$ pieces of data, or otherwise, outputs the second conversion control data (equal to the first value "0") corresponding to the $a_1+a_2=8$ pieces of data. In the eight fifth combination logic circuits, in each thereof, A3 is the second conversion control data output by the comparing circuit, B3 is one of the $a_1+a_2=8$ pieces of data, corresponding to the second conversion control data (that is, A3), output by the data read unit 41. For example, B3 of the first circuit of the fifth combination logic circuits is D0' of the eight pieces of data D0', D1', D2', D3', D4', D5', D6', and D7' output from the data read unit 41, B3 of the second circuit of the fifth combination logic circuits is D1', B3 of the third circuit of the fifth combination logic circuits is D2', B3 of the fourth circuit of the fifth combination logic circuits is D3', B3 of the fifth circuit of the fifth combination logic circuits is D4', B3 of the sixth circuit of the fifth combination logic circuits is D5', B3 of the seventh circuit of the fifth combination logic circuits is D6', and B3 of the eighth circuit of the fifth combination logic circuits is D7'. Thereby, when the second conversion control data is the first value "0", that is, A3=0, the eight fifth combination logic circuits output $\overline{A3} \cdot \overline{B3} + A3 \cdot B3 = \overline{B3}$, that is, output the negated data $\overline{D0'}, \overline{D2'}, \overline{D3'}, \overline{D4'}, \overline{D5'}, \overline{D6'},$ and $\overline{D7'}$ of the data D0', D1', D2', D3', D4', D5', D6', and DT; otherwise, A3=1, the eight fifth combination logic circuits output $\overline{A3} \cdot \overline{B3} + A3 \cdot B3 = B3$, that is, output the data D0', D', D', D2', D3', D4', D5', D6', and D7'. Therefore, after the operation for b=8 times, the output data generating unit 43 may in total output $a*b=a_1*b+a_2*b=4*8+4*8=8*8$ pieces of data and the second conversion control data corresponding to every a=8 pieces of data. For example, the a*b=8*8 pieces of data and the second conversion control data corresponding to every a=8 pieces of data in total output by the output data generating unit 43 are respectively shown in Table 6 and Table 7, in which, the first data to the eighth data of the second conversion control data are respectively corresponding to 8 pieces of data in the first to the eighth column in Table 6.

TABLE 6

| D0" | D1" | D2" | D3" | D4" | D5" | D6" | D7" |
|---|---|---|---|---|---|---|---|
| D8" | D9" | D10" | D11" | D12" | D13" | D14" | D15" |
| D16" | D17" | D18" | D19" | D20" | D21" | D22" | D23" |
| D24" | D25" | D26" | D27" | D28" | D29" | D30" | D31" |
| D32" | D33" | D34" | D35" | D36" | D37" | D38" | D39" |
| D40" | D41" | D42" | D43" | D44" | D45" | D46" | D47" |
| D48" | D49" | D50" | D51" | D52" | D53" | D54" | D55" |
| D56" | D57" | D58" | D59" | D60" | D61" | D62" | D63" |

TABLE 7

| D64" | D65" | D66" | D67" | D68" | D69" | D70" | D71" |
|---|---|---|---|---|---|---|---|

The second check data generating unit 44 is connected to an output end of the output data generating unit 43, and used for generating second check data according to a*b pieces of data and b pieces of second conversion control data from the output data generating unit 43.

The circuit structure of the second check data generating unit 44 is determined according to a communication protocol between the read circuit and a peripheral apparatus connected thereto.

For example, the peripheral apparatus connected to the read circuit is a memory controller, and preferably, the second check data generating unit 44 includes a generating circuit for generating cyclic redundancy check data.

For example, the generating circuit included by the second check data generating unit 44 generates the second check data CRC0', CRC1', CRC2', CRC3', CRC4', CRC5', CRC6', and CRC7' according to a*b=8*8 pieces of data output by the output data generating unit 43, for example, 8*8 pieces of data shown in Table 6 and b=8 pieces of second conversion control data shown in Table 7, and preferably, the generating circuit includes a combination logic circuit whose logic relational expression is Expression 6.

Expression 6

$$CRC0' = [D69"]\wedge[D68"]\wedge[D67"]\wedge[D66"]\wedge[D64"]\wedge[D63"]\wedge$$
$$[D60"]\wedge[D56"]\wedge[D54"]\wedge[D53"]\wedge[D52"]\wedge[D50"]\wedge$$
$$[D49"]\wedge[D48"]\wedge[D45"]\wedge[D43"]\wedge[D40"]\wedge[D39"]\wedge$$
$$[D35"]\wedge[D34"]\wedge[D31"]\wedge[D30"]\wedge[D28"]\wedge[D23"]\wedge$$
$$[D21"]\wedge[D19"]\wedge[D18"]\wedge[D16"]\wedge[D14"]\wedge[D12"]\wedge$$
$$[D8"]\wedge[D7"]\wedge[D6"]\wedge[D0"];$$

$$CRC1' = [D70"]\wedge[D66"]\wedge[D65"]\wedge[D63"]\wedge[D61"]\wedge[D60"]\wedge$$
$$[D57"]\wedge[D56"]\wedge[D55"]\wedge[D52"]\wedge[D51"]\wedge[D48"]\wedge$$
$$[D46"]\wedge[D45"]\wedge[D44"]\wedge[D43"]\wedge[D41"]\wedge[D39"]\wedge$$
$$[D36"]\wedge[D34"]\wedge[D32"]\wedge[D30"]\wedge[D29"]\wedge[D28"]\wedge$$
$$[D24"]\wedge[D23"]\wedge[D22"]\wedge[D21"]\wedge[D20"]\wedge[D18"]\wedge$$
$$[D17"]\wedge[D16"]\wedge[D15"]\wedge[D14"]\wedge[D13"]\wedge[D12"]\wedge$$
$$[D9"]\wedge[D6"]\wedge[D1"]\wedge[D0"];$$

$$CRC2' = [D71"]\wedge[D69"]\wedge[D68"]\wedge[D63"]\wedge[D62"]\wedge[D61"]\wedge$$
$$[D60"]\wedge[D58"]\wedge[D57"]\wedge[D54"]\wedge[D50"]\wedge[D48"]\wedge$$
$$[D47"]\wedge[D46"]\wedge[D44"]\wedge[D43"]\wedge[D42"]\wedge[D39"]\wedge$$
$$[D37"]\wedge[D34"]\wedge[D33"]\wedge[D29"]\wedge[D28"]\wedge[D25"]\wedge$$
$$[D24"]\wedge[D22"]\wedge[D17"]\wedge[D15"]\wedge[D13"]\wedge[D12"]\wedge$$
$$[D10"]\wedge[D8"]\wedge[D6"]\wedge[D2"]\wedge[D1"]\wedge[D0"];$$

$$CRC3' = [D70"]\wedge[D69"]\wedge[D64"]\wedge[D63"]\wedge[D62"]\wedge[D61"]\wedge$$
$$[D59"]\wedge[D58"]\wedge[D55"]\wedge[D51"]\wedge[D49"]\wedge[D48"]\wedge$$
$$[D47"]\wedge[D45"]\wedge[D44"]\wedge[D43"]\wedge[D40"]\wedge[D38"]\wedge$$
$$[D35"]\wedge[D34"]\wedge[D30"]\wedge[D29"]\wedge[D26"]\wedge[D25"]\wedge$$
$$[D23"]\wedge[D18"]\wedge[D16"]\wedge[D14"]\wedge[D13"]\wedge[D11"]\wedge$$
$$[D9"]\wedge[D7"]\wedge[D3"]\wedge[D2"]\wedge[D1"];$$

$$CRC4' = [D71"]\wedge[D70"]\wedge[D65"]\wedge[D64"]\wedge[D63"]\wedge[D62"]\wedge$$
$$[D60"]\wedge[D59"]\wedge[D56"]\wedge[D52"]\wedge[D50"]\wedge[D49"]\wedge$$
$$[D48"]\wedge[D46"]\wedge[D45"]\wedge[D44"]\wedge[D41"]\wedge[D39"]\wedge$$
$$[D36"]\wedge[D35"]\wedge[D31"]\wedge[D30"]\wedge[D27"]\wedge[D26"]\wedge$$
$$[D24"]\wedge[D19"]\wedge[D17"]\wedge[D15"]\wedge[D14"]\wedge[D12"]\wedge$$
$$[D10"]\wedge[D8"]\wedge[D4"]\wedge[D3"]\wedge[D2"];$$

$$CRC5' = [D71"]\wedge[D66"]\wedge[D65"]\wedge[D64"]\wedge[D63"]\wedge[D61"]\wedge$$
$$[D60"]\wedge[D57"]\wedge[D53"]\wedge[D51"]\wedge[D50"]\wedge[D49"]\wedge$$
$$[D47"]\wedge[D46"]\wedge[D45"]\wedge[D42"]\wedge[D40"]\wedge[D37"]\wedge$$
$$[D36"]\wedge[D32"]\wedge[D31"]\wedge[D28"]\wedge[D27"]\wedge[D25"]\wedge$$
$$[D20"]\wedge[D18"]\wedge[D16"]\wedge[D15"]\wedge[D13"]\wedge[D11"]\wedge$$
$$[D9"]\wedge[D5"]\wedge[D4"]\wedge[D3"];$$

$$CRC6' = [D67"]\wedge[D66"]\wedge[D65"]\wedge[D64"]\wedge[D62"]\wedge[D61"]\wedge$$
$$[D58"]\wedge[D54"]\wedge[D52"]\wedge[D51"]\wedge[D50"]\wedge[D48"]\wedge$$
$$[D47"]\wedge[D46"]\wedge[D43"]\wedge[D41"]\wedge[D38"]\wedge[D37"]\wedge$$
$$[D33"]\wedge[D32"]\wedge[D29"]\wedge[D28"]\wedge[D26"]\wedge[D21"]\wedge$$
$$[D19"]\wedge[D17"]\wedge[D16"]\wedge[D14"]\wedge[D12"]\wedge[D10"]\wedge$$
$$[D6"]\wedge[D5"]\wedge[D4"];$$

$$CRC7' = [D68"]\wedge[D67"]\wedge[D66"]\wedge[D65"]\wedge[D63"]\wedge[D62"]\wedge$$
$$[D59"]\wedge[D55"]\wedge[D53"]\wedge[D52"]\wedge[D51"]\wedge[D49"]\wedge$$
$$[D48"]\wedge[D47"]\wedge[D44"]\wedge[D42"]\wedge[D39"]\wedge[D38"]\wedge$$
$$[D34"]\wedge[D33"]\wedge[D30"]\wedge[D29"]\wedge[D27"]\wedge[D22"]\wedge$$
$$[D20"]\wedge[D18"]\wedge[D17"]\wedge[D15"]\wedge[D13"]\wedge[D11"]\wedge$$
$$[D7"]\wedge[D6"]\wedge[D5"].$$

The second adjusting unit 45 is connected to an output end of the second check data generating unit 44 and an output end of the second check unit 42, and used for, when the second check unit outputs the second check result indicating that data is incorrect, adjusting the second check data and then outputting the adjusted second check data; otherwise directly outputting the second check data.

For example, the second adjusting unit 45 is used for adjusting the second check data CRC0', CRC1', CRC2', CRC3', CRC4', CRC5', CRC6', and CRC7' output by the second check data generating unit 44 when the second check unit outputs a second check result indicating data is incorrect.

Preferably, the second adjusting unit 45 includes one sixth combination logic circuits whose logic relational expression is $\overline{A4}\cdot\overline{B4}+A4\cdot B4$, in which, A4 is data output by the second check unit, and B4 indicates one of the second check data CRC0', CRC1', CRC2', CRC3', CRC4', CRC5', CRC6', and CRC7' output by the second check data generating unit 44, for example, the data CRC4'. Thereby, when the second check unit 42 outputs a second check result indicating data is incorrect, that is, A4="0", the sixth combination logic circuit outputs $\overline{B4}=\overline{CRC4'}$, that is, the second adjusting unit 45 directly outputs the second check data CRC0', CRC1', CRC2', CRC3', CRC5', CRC6', and CRC7' without performing any processing, only negates CRC4' and then outputs the negated CRC4'; when the second check unit 42 outputs a second check result indicating data is correct, that is, A4="1", the second adjusting unit 45 outputs the second check data CRC0', CRC1', CRC2', CRC3', CRC4', CRC5', CRC6', and CRC7'.

It should be noted that, the structure of the second adjusting unit 45 is not limited to the foregoing structure. Actually, the second adjusting unit 45 may also include multiple combination logic circuits whose logic relational expressions are $\overline{A4}\cdot\overline{B4}+A4\cdot B4$, and is used for, when the second check unit outputs a second check result indicating data is incorrect, negating multiple of the second check data CRC0', CRC1', CRC2', CRC3', CRC4', CRC5', CRC6', and CRC7' output by the second check data generating unit 44 and then outputting the negated data.

The output unit 46 is separately connected to the output end of the output data generating unit 43 and an output end of the second adjusting unit 45, used for, through a fourth data bus, outputting the a*b pieces of data from the output data generating unit 43 and the second check data and a pieces of data 1 from the second adjusting unit, in which, whenever a pieces of data are output, and second conversion control data corresponding to the a pieces of data is output through a second data conversion control line.

For example, the output unit 46 outputs a=8 pieces of data from the output data generating unit 43 every time through DQ4[7:0] in the fourth data bus at the ascending edge and descending edge of the generated read data collecting signal output by DQS4 in the fourth data bus, so as to in total output a*b=8*8 pieces of data, for example, the first to the eighth column of data shown in Table 6, to the memory controller 1, and at the same time of outputting the first column of data, the second column of data, . . . , and the eighth column of data, the first data of the second conversion control data, the second data of the second conversion control data, . . . , and the eighth data of the second conversion control data in Table 7 are separately output through a data conversion control line; then 8 pieces of second check data from the second adjusting unit 45 are output to the memory controller 1 through the fourth data bus, and at the same time, the second data conversion control line is enabled to output the data "1"; then DQ4[7:0] in the fourth data bus is enabled to output 8 pieces of data "1" to the memory controller 1, and at the same time the second data conversion control line is enabled to output the data "1".

Persons skilled in the art should understand that, the output unit 46 may generate the read data collecting signal output by DQS4 in the fourth data bus by delaying the read data collecting signal from DQS3 in the third data bus, which is therefore not detailed again herein.

To sum up, the read circuit consistent with the present invention can integrate data in multiple memory chips into a group of data, and output the group of data to a memory controller, and especially may integrate 32 pieces of data stored in two DDR4 X4 memory chips into 64 pieces of data, and then output the 64 pieces of data to the memory controller based on the conversion control data, so the read circuit may output the read data to the memory controller in a low power consumption manner.

Figure 3:
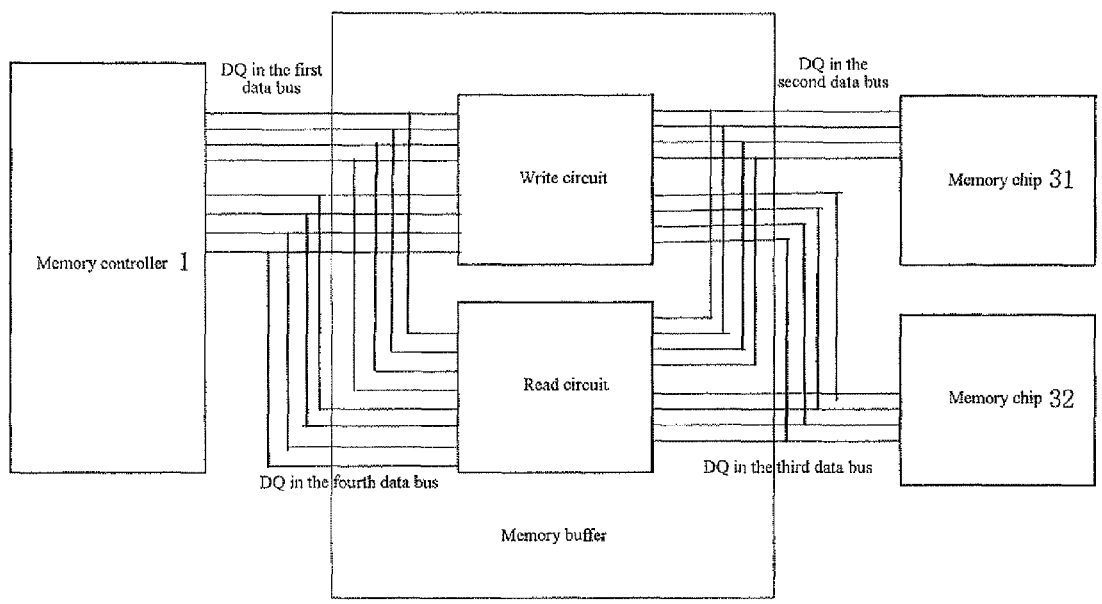
FIG. 3 is a schematic view of a memory buffer consistent with the present invention.

FIG. 3 is a schematic view of a memory buffer according to a preferable embodiment of the present invention. The memory buffer includes: a write circuit, a read circuit and a control circuit (not shown), in which, the first data bus included by the write circuit is connected to the fourth data bus included by the read circuit, the second data bus included by the write circuit is connected to the third data bus included by the read circuit, the first data conversion control line (not shown) included by the write circuit is connected to the second data conversion control line (not shown) included by the read circuit, and the control circuit is disposed with a control signal bus (not shown), used for controlling the write circuit and the read circuit according to a received control signal.

When receiving a write data instruction through the control signal bus, the control circuit controls the write circuit to execute an operation, and when receiving a read data instruction through the control signal bus, the control circuit controls the read circuit to execute an operation.

It should be noted that, persons skilled in the art should understand the circuit structure of the control circuit according to the foregoing illustration, which is therefore not detailed again herein. Moreover, in order to simplify the diagram, none of DQS1 in the first data bus, DQS2 in the second data bus, DQS3 in the third data bus, and DQS4 in the fourth data bus is shown.

The write circuit is the write circuit 2 shown in FIG. 1, and the read circuit is the read circuit 4 shown in FIG. 2, which are therefore not detailed again herein.

Preferably, the memory chips 31 and 32 are both a DDR4 X4 memory chip.

The procedure that the memory buffer writes data into a memory chip is as follows.

For example, after receiving a write data instruction, the control circuit controls the write circuit to begin to execute an operation. after the memory controller 1 inputs 64 pieces of data, 8 pieces of check data and 8 pieces of data "1" to the memory buffer through the first data bus, the data collecting unit of the write circuit of the memory buffer collects the data from the first data bus and the first conversion control data from the first conversion control line according to the write data collecting signal, then the first check unit of the write circuit checks 64 pieces of data and 8 pieces of first conversion control data from the data collecting unit according to 8 pieces of check data from the data collecting unit, the data restoring unit of the write circuit determines whether the corresponding 8 pieces of data are negated and then output or directly output based on the first conversion control data from the data collecting unit, then, the first check data generating circuit of the write circuit generates two groups of first check data respectively according to 32 pieces of the 64 pieces of data output by the data restoring unit, subsequently the first adjusting unit of the write circuit determines whether the two generated groups of first check data are adjusted according to a first check result output by the first check unit and indicating whether data is correct, and finally the write unit of the write circuit writes one group of 32 pieces of data and the first check data corresponding to the group of 32 pieces of data into the memory chip 31, and writes the other group of 32 pieces of data and the first check data corresponding to the other group of 32 pieces of data into the memory chip 32.

The procedure that the memory buffer reads data in a memory chip out is as follows.

For example, after the control circuit of the memory buffer receives a read data instruction, the control circuit controls the read circuit to begin to execute an operation. That is, the read circuit respectively reads 32 pieces of data and the first group of check data through the memory chip 31, and reads 32 pieces of data and the second group of check data through the memory chip 32; then the second check unit of the read circuit separately checks the 32 pieces of data from the memory chip 31 and the 32 pieces of data from the memory chip 32 respectively based on the first group of check data and the second group of check data; the output data generating unit of the read circuit determines the second conversion control data respectively corresponding to every 8 pieces of data of the 64 pieces of data according to the 32 pieces of data from the memory chip 31 and the 32 pieces of data from the memory chip 32, that is, 32+32=64 pieces of data, and determines whether the 8 pieces of data corresponding to the second conversion control data are negated and output, or directly output based on each of the determined second conversion control data; then the read circuit generates the second check data based on the 64 pieces of data and the 8 pieces of conversion control data output by the output data generating unit; then the second adjusting unit of the read circuit adjusts the second check data based on a second check result output by the second check unit and indicating whether data is correct, and finally, the output unit of the read circuit outputs the 64 pieces of data from the output data generating unit, and the second check data and 8 pieces of data "1" from the second adjusting unit, outputs the second conversion control data corresponding to the 8 pieces of data through the first data conversion control line whenever 8 pieces of data are output, and outputs the second conversion control data "1" corresponding to the 8 pieces of data through the first data conversion control line when the second check data output by the second adjusting unit is output to the memory controller 1 through the fourth data bus, so that while the fourth data bus outputs 8 pieces of data "1" to the memory controller 1, the first data conversion control line is enabled to output the second conversion control data "1" corresponding to the 8 pieces of data.

To sum up, the memory buffer consistent with the present invention can write the data input based on the conversion control data into a DDR4 X4 memory chip, and can also output the data of the DDR4 X4 memory chip to the memory controller based on the conversion control data, so the memory buffer consistent with the present invention may transmit data with the memory controller in a low power consumption manner, and may further take advantage of the large capacity of the DDR4 X4 memory chip at the same time.

Figure 4:
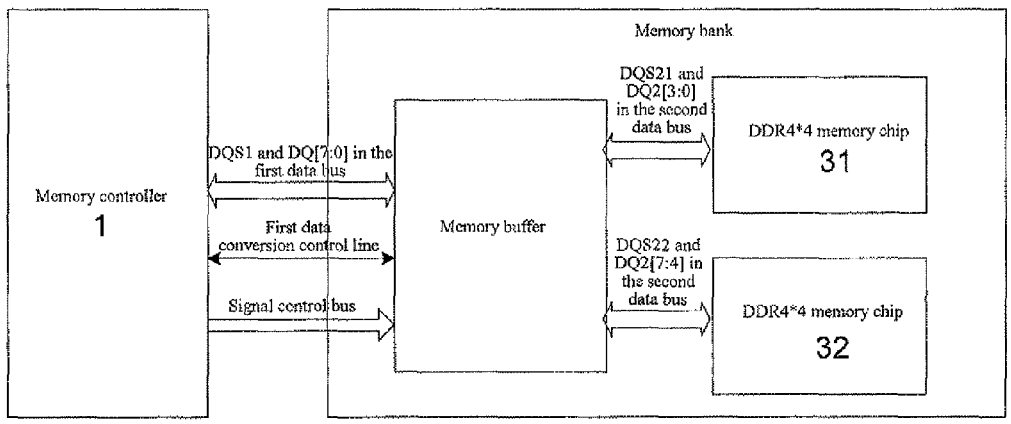
FIG. 4 is a schematic view of a memory module consistent with the present invention.

FIG. 4 is a schematic view of a memory module according to a preferable embodiment of the present invention. The memory module includes: a memory buffer and at least two memory chips, in which, the second data bus included by the memory buffer is connected to the at least two memory chips.

The memory buffer is the same as or similar to the memory buffer shown in FIG. 3, which is not detailed again herein.

For example, as shown in FIG. 4, DQS1 and DQ in the first data bus, the first data conversion control line and the control signal bus of the memory buffer are separately connected to the memory controller, so that data is acquired through the memory controller or data is output to the memory controller, DQS22 and DQ2[7:4] in the second data bus of the memory buffer are connected to the memory chip 32, and DQS21 and DQ2[3:0] in the second data bus are connected to the memory chip 31, so that a read or write operation is performed on data of the memory chip 31 and the memory chip 32.

Preferably, the memory buffer transmits data with the memory controller based on the conversion control data, and the memory chips 31 and 32 are a DDR4 X4 memory chip.

It should be noted that, persons skilled in the art should understand that, the memory module is merely exemplified, and not intended to limit the present invention, and actually, the number of memory chips included by the memory module and the model of the memory chips are not limited as shown in the diagram.

The above description of the detailed embodiments is only to illustrate the preferred implementation according to the present invention, and it is not to limit the scope of the present invention. Accordingly, all modifications and variations completed by those with ordinary skill in the art should fall within the scope of the present invention defined by the appended claims.

What is claimed is:

1. A write circuit for writing data into a memory chip, comprising:

a data collecting unit, disposed with a first data bus and a first data conversion control line, and used every time slot by the first data bus, the data bus having a data bus width a, for collecting a pieces of data and by the first data conversion control line for collecting first conversion control data corresponding to every a pieces of data, so as to collect a*b pieces of data to be checked and a pieces of check data in total, b being a number of time slots, a*b being a numerical multiplication of the data bus width a and the number of time slots b;

a first check unit, connected to an output end of the data collecting unit, and used for checking whether a*b pieces of data to be checked and the b pieces of first conversion control data from the data collecting unit are incorrect according to the a pieces of check data from the data collecting unit, so as to output a first check result indicating whether data is correct;

a data restoring unit, connected to the output end of the data collecting unit, and used for, when the first conversion control data from the data collecting unit is a first value "0", negating a pieces of data to be checked corresponding to the conversion control data and then outputting the negated data; otherwise directly outputting the a pieces of data to be checked;

a first check data generating unit, connected to an output end of the data restoring unit, and used for separately generating a group of first check data according to a $a_1$*b pieces of data and $a_2$*b pieces of data of a*b pieces of data from the data restoring unit respectively, wherein, $a_1$*b+$a_2$*b is equal to a*b, $a_1$ being half of the data bus width a and $a_2$ being another half of the data bus width a, $a_1$*b being a numerical multiplication of $a_1$ and b and $a_2$*b being a numerical multiplication of $a_2$ and b;

a first adjusting unit, connected to an output end of the first check data generating unit and an output end of the first check unit, and used for, when the first check unit outputs the first check result indicating that data is incorrect, adjusting each group of first check data; otherwise, performing no adjustment; and a write unit, separately connected to an output end of the first adjusting unit and the output end of the data restoring unit, and used for outputting the $a_1*b$ pieces of data of the a*b pieces of data from the data restoring unit and a group of first check data corresponding to the $a_1*b$ pieces of data output by the first adjusting unit to a memory chip through a second data bus, and outputting the $a_2*b$ pieces of data the a*b pieces of data from the data restoring unit and a group of first check data corresponding to the $a_2*b$ pieces of data output by the first adjusting unit to another memory chip through the second data bus.

2. The write circuit as in claim 1, wherein the data collecting unit comprises a timing correcting circuit, used for correcting the timing according to a write data collecting signal from the first data bus so as to correctly collect data from the first data bus and conversion control data from the first data conversion control line.

3. The write circuit as in claim 1, wherein the first check unit comprises:
a first generating circuit, connected to the output end of the data collecting unit, and used for generating first to-be-compared check data according to the a*b pieces of data to be checked from the data collecting unit and the b pieces of first conversion control data from the data collecting unit; and
a first comparing circuit, connected to an output end of the first generating circuit and the output end of the data collecting unit, and used for comparing the first to-be-compared check data and the check data from the data collecting unit to output the first check result indicating whether data is correct.

4. The write circuit as in claim 3, wherein the first generating circuit comprises a generating circuit for generating cyclic redundancy check data.

5. The write circuit as in claim 1, wherein the first check data generating unit comprises a group of generating circuit for generating cyclic redundancy check data.

6. A memory buffer, comprising a control circuit disposed with a control signal bus, and further comprising:
the write circuit as in claim 1, wherein, the first data bus comprised by the write circuit is connected to the fourth data bus comprised by the read circuit, the second data bus comprised by the write circuit is connected to the third data bus comprised by the read circuit, the first data conversion control line comprised by the write circuit is connected to the second data conversion control line comprised by the read circuit, and the control circuit is used for controlling a read/write operation of the write circuit and the read circuit according to a received control signal.

7. A memory module, comprising: the memory buffer as in claim 6 and at least two memory chips, wherein, the second data bus comprised by the memory buffer is connected to each of the memory chips.

8. The memory module as in claim 7, wherein the memory chips comprise a DDR4 X4 memory chip.

9. A read circuit for reading data out of a memory chip, comprising:
a data read unit, disposed with a third data bus, the third data bus having a data bus width $a_1+a_2$, $a_1$ being a half of the third data bus width and a2 being another half of the third data bus width, the third data bus connected to two memory chips, and used, through the third data bus, by one memory chip for reading $a_1*b$ pieces of data and corresponding first group of check data, and by the other memory chip for reading $a_2*b$ pieces of data and corresponding second group of check data, b being an output data time slot number, $a_1*b$ being a numerical multiplication of $a_1$ and b, $a_2*b$ being a numerical multiplication of $a_2$, and b, a second check unit, connected to an output end of the data read unit, and used for checking whether the $a_1*b$ pieces of data from the data read unit are incorrect according to the first group of check data, and checking whether the $a_2*b$ pieces of data from the data read unit are incorrect according to the second group of check data, so as to output a second check result indicating whether the $a_1*b+a_2*b$ pieces of second data are incorrect, $a_1*b+a_2*b$ being a sum of $a_1*b$ and $a_2*b$;

an output data generating unit, connected to the output end of the data read unit, and used for determining second conversion control data corresponding to every a pieces of data of a*b pieces of data from the data read unit, and when the determined second conversion control data is a first value, negating a pieces of data corresponding to the second conversion control data and then outputting the negated data; otherwise directly outputting the a pieces of data, and outputting the second conversion control data corresponding to every a pieces of data, wherein, $a*b=a_1*b+a_2*b$, and a*b being a numerical multiplication of the data bus width a and the number of time slots b;

a second check data generating unit, connected to an output end of the output data generating unit, and used for generating second check data according to a*b pieces of data and b pieces of second conversion control data from the output data generating unit;

a first adjusting unit, connected to an output end of the second check data generating unit and an output end of the second check unit, and used for, when the second check unit outputs the second check result indicating that data is incorrect, adjusting the second check data and then outputting the adjusted second check data; otherwise directly outputting the second check data; and an output unit, separately connected to the output end of the output data generating unit and an output end of the second adjusting unit, used for, through a fourth data bus, outputting the a*b pieces of data from the output data generating unit and the second check data and a pieces of data 1 from the second adjusting unit, wherein, whenever a pieces of data are output, and second conversion control data corresponding to the a pieces of data is output through a second data conversion control line.

10. The read circuit as in claim 9, wherein the data read unit comprises a timing correcting circuit, used for correcting the timing according to a read data collecting signal from the third data bus so as to accurately read data through the third data bus.

11. The read circuit as in claim 9, wherein the data read unit comprises a read sub-unit, used every time slot by one memory chip for reading a1 pieces of data, and by the other memory chip for reading $a_2$ pieces of data, and outputting $a_1+a_2$ pieces of data, $a_1+a_2$ being a sum of the number of pieces of data $a_1$ and the number of pieces of data $a_2$.

12. The read circuit as in claim 9, wherein the second check unit comprises:
a second generating circuit, used for generating a first group of second to-be-compared check data and a second group of second to-be-compared check data separately according to the $a_1*b$ pieces of data and the $a_2*b$ pieces of data from the data read unit respectively; and a second comparing circuit, connected to an output end of the second generating circuit and the output end of the data read unit, and used for comparing the first group of second to-be-compared check data and the first group of check data from the data read unit, and comparing the second group of second to-be-compared check data and the second group of check data output from the data read unit so as to output the second check result indicating whether the $a_1*b+a_2*b$ pieces of data are incorrect.

13. The read circuit as in claim 11, wherein the second generating circuit comprises a generating circuit for generating cyclic redundancy check data.

14. The read circuit as in claim 9, wherein the second check data generating unit comprises a generating circuit for generating cyclic redundancy check data.

15. A memory buffer, comprising a control circuit disposed with a control signal bus, and further comprising:

the read circuit as in claim 9, wherein, the first data bus comprised by the write circuit is connected to the fourth data bus comprised by the read circuit, the second data bus comprised by the write circuit is connected to the third data bus comprised by the read circuit, the first data conversion control line comprised by the write circuit is connected to the second data conversion control line comprised by the read circuit, and the control circuit is used for controlling a read/write operation of the write circuit and the read circuit according to a received control signal.

* * * * *